(12) United States Patent
Shinogi et al.

(10) Patent No.: US 6,534,387 B1
(45) Date of Patent: Mar. 18, 2003

(54) SEMICONDUCTOR DEVICE AND METHOD OF MANUFACTURING THE SAME

(75) Inventors: Hiroyuki Shinogi, Gunma (JP); Ryoji Tokushige, Gunma (JP); Nobuyuki Takai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 52 days.

(21) Appl. No.: 09/680,613

(22) Filed: Oct. 6, 2000

(30) Foreign Application Priority Data

Dec. 21, 1999 (JP) .......................................... 11-361998

(51) Int. Cl.[7] ............................................ H01L 21/301
(52) U.S. Cl. ........................ 438/465; 438/462; 438/114
(58) Field of Search .................................. 438/460–462, 438/464, 465, 928, 977, 476, 114–129, 143, 405, 459

(56) References Cited

FOREIGN PATENT DOCUMENTS

JP         61112345 A    *  5/1986  ............ H01L/21/78

* cited by examiner

Primary Examiner—Wael Fahmy, Jr.
Assistant Examiner—Thanh Pham
(74) Attorney, Agent, or Firm—Fish & Richardson P.C.

(57) ABSTRACT

After a metal post 8 is formed on a semiconductor wafer 20, a groove 21 is formed in a first dicing step. The semiconductor wafer is resin-sealed by a rein layer R from its upper surface. The semiconductor wafer is ground from its lower surface to a depth reaching the bottom of the groove 21 so that the semiconductor wafer is divided into individual chips 20A. The resin layer is ground to expose the head of the metal post. After a solder ball is loaded on the metal post 8, the portion of the resin layer between adjacent chips 20A is diced in a second dicing step so that the individual chips 20A are separated from one another.

13 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing it, and more particularly to a method of manufacturing a chip size package. The chip size package (CSP) generally refers to a package which has a size approximately equal to or slightly larger than a chip size, and intends high-density mounting on the printed(/ circuit) board. The present invention relates to technology for improving reliability of the formation of a metal post adopted for the CSP.

2. Description of the Related Art

In this technical field, previously known are a structure called "BGA (Ball Grid Array)" having a plurality of solder balls arranged in a plane, a structure called "fine pitch BGA" in which the ball pitch of the BGA is further decreased to reduce the external shape to a chip size, etc.

In recent years, a wafer CSP has been proposed in "NIKKEI MICRODEVICE" August, 1998, pp 44–71. This wafer CSP is a CSP in which wirings and pads in an array are basically formed in a wafer process (pre-step) before chip dicing. This technique is expected that it can integrate the wafer process and package process (post-step) to reduce package cost greatly.

The wafer CSP is classified into a resin-sealing type and a rearrangement wiring type (hereinafter referred to as rewiring type). The resin sealing type has a structure with the surface covered with sealing resin like a conventional package, in which metal posts are formed on a wiring layer on the chip surface and the periphery thereof is sealed with sealing resin.

Generally, it is said that when a package is loaded on a printed board, the stress generated owing to a difference in their thermal expansion coefficient therebetween is concentrated to the metal posts, but the resin sealing type, which has the metal posts with an increased length, can disperse the stress.

On the other hand, the rewiring type has a structure in which rewiring is made without using sealing resin as shown in FIG. 10. Specifically, an Al electrode 52, a wiring layer 53 and an insulating layer 54 are stacked on the surface of a chip 51, and a metal post 55 is formed on the wiring layer 53. A solder ball is formed on the metal post 56. The wiring layer 53 is used as a rewiring for arranging the solder ball 56 in a prescribed array on the chip.

The resin sealing type in which the metal post with a length increased to about 100 μm is reinforced by sealing resin can acquire great reliability. However, the process of resin sealing using a transfer molding must be carried out using a old. This complicates the manufacturing process.

On the other hand, the rewiring type has an advantage that the manufacturing process is relatively simple and most steps thereof can be performed in a wafer process. However, any means is required to relax the stress by any technique to enhance the reliability.

Where an Al electrode is used, at least one layer of barrier metal (not shown) is formed between the metal post 55 and Al electrode 52, and the solder ball 56 is formed on the metal post 55.

The wafer CSP described above is sealed using e.g. epoxy resin. In this case, the epoxy resin layer is polished to expose the head of the metal post. This step is succeeded by a dicing step. In such a process, the wafer will greatly warp owing to the stress applied to the wafer and resin.

Where the wafer subjected to such warp is transported in a manufacturing line, a transporting error occurred sometimes. This was remarkable as the diameter of the wafer increases.

The problem of warping is also hindrance when height of the metal post is increased in order to enhance the reliability.

SUMMARY OF THE INVENTION

The present invention has been accomplished under the above circumstance.

An object of the invention is to provide a semiconductor device which can prevent warp of a wafer and give great reliability.

In order to attain the above object, in accordance with the invention, there is provided a method of manufacturing a semiconductor device comprising the steps: preparing a semiconductor wafer having a wiring layer for external connection and a dicing groove having a prescribed depth; covering an upper surface of the semiconductor wafer with a resin layer; grinding the semiconductor wafer from its lower surface to the bottom of the groove; grinding the resin layer to expose the head of the wiring layer; and forming an external connection terminal to the exposed head.

The above and other objects and features of the present invention will be more apparent from the following description taken in conjunction with the accompanying drawings.

DESCRIPTION OF THE PREFERRED EMBODIMENTS

Figure 1:
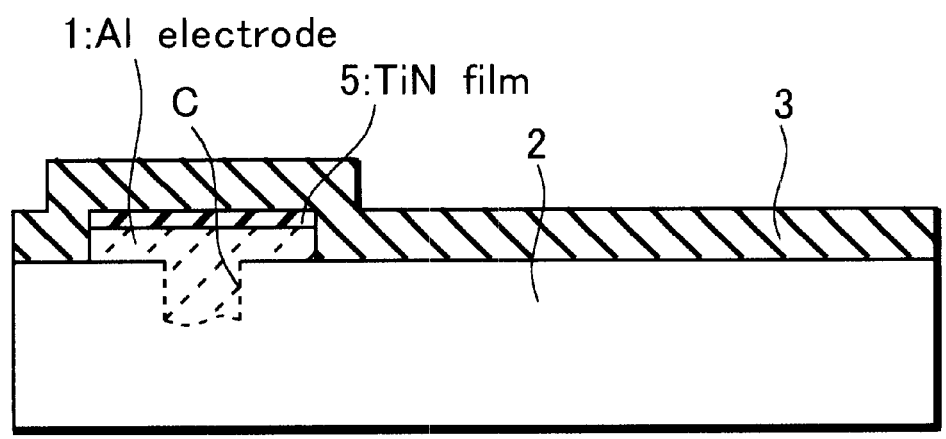
FIGS. 1 to 9 are sectional views for explaining a method of manufacturing a semiconductor device according to an embodiment of the present invention.

Now referring to the drawings, an explanation will be given of a method of manufacturing a semiconductor device according to an embodiment of the invention.

The present invention is characterized by comprising the steps: preparing a semiconductor wafer having a wiring layer for external connection and a dicing groove having a prescribed depth; covering an upper surface of the semiconductor wafer with a resin layer; grinding the semiconductor wafer from its lower surface to the bottom of the groove; grinding the resin layer to expose the head of the wiring layer; and forming an external connection terminal to the exposed head.

Figure 7:
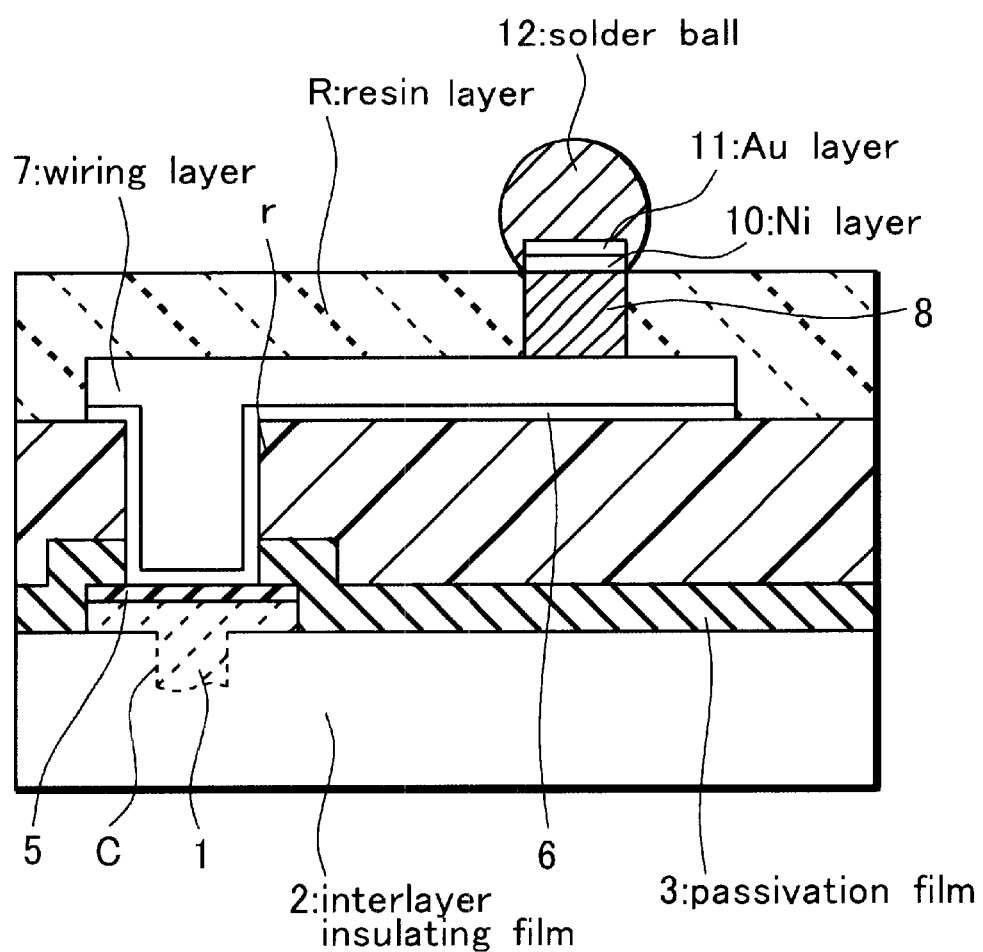

A detailed explanation will be given of the respective steps. As seen from FIG. 8A, after metal posts 8 are formed on a wafer 20, grooves 21 are formed by a first dicing step. Next, as seen from FIG. 8B, the entire surface of the wafer is resin-sealed by a resin layer R. Further, as seen from FIG. 8C, the wafer is divided into individual chips 20A by polishing the rear surface of the wafer to reach the bottom of each of the grooves 21 (In this case, the individual chips 20A are integrated by the resin R. Further, as seen from FIG. 9A, the resin layer R is polished to expose the head of each of the metal posts 8. As seen from FIG. 9B, a solder ball 12 is loaded on the metal post 8. Thereafter, the portion of the resin layer R between the adjacent chips 20A is diced so that the wafer is separated into individual chips 20A. In FIG. 7, reference numeral 1 denotes an uppermost metal (serving as a bonding pad) in an IC chip of a general wire bonding type, and reference numeral 2 denotes an interlayer insulating film (e.g. BPSG film ) in which a contact hole C for the Al electrode 1 is formed.

In the lower portion of the contact hole C, a plurality of metal layers are formed which are kept in contact with a diffused region, poly-Si gate, poly-Si, etc. of a transistor (MOS type of transistor or BIP type of transistor).

Although this embodiment will be explained in connection with the MOS type transistor, it is needless to say that the present invention can be applied to the BIP type transistor.

The structure according to this embodiment is applicable to an IC generally called the single metal layer, double metal layer, multi-layered metal layer and so on.

Reference numeral 3 denotes a passivation film 3. The passivation film 3 is made of silicon nitride film (hereinafter referred to as $Si_3N_4$ film) (epoxy resin or polyimide resin can be adopted). The passivation layer is covered with an insulating layer r of e.g. epoxy resin. The insulating resin layer r, as described later, realize surface flatness to make uniform the height of the solder ball.

A Ti nitride (TiN) film 5 serving as a cap metal is formed on the Al electrode 1.

An opening K from which the Ti nitride (TiN) film 5 is exposed is formed in the passivation film 3 and insulating resin layer r. A Cu thin film layer 6 which serves a plating electrode (seed layer) for a wiring layer is formed on the entire surface inclusive of the opening. The wiring layer 7 is formed by Cu plating.

An insulating resin layer R is formed on the entire chip surface inclusive of the wiring layer 7. Although not shown, in order to prevent the reaction between the resin layer R and Cu, as described later, an $Si_3N_4$ film may be formed between the interface between the resin layer R and wiring layer 7 and between the insulating resin layer R and the metal post 8.

The insulating resin layer R may be made of any resin as long as it is thermosetting resin or thermoplastic resin. Particularly, the thermosetting resin may be preferably amic acid film, polyimide, or epoxy resin. The thermoplastic resin may be preferably thermoplastic polymer ("HIMAL" available from HITACHI KASEI Co. Ltd). The amic acid film has a contraction ratio of 30–50%.

The insulating resin layer R is formed by spinning the material mainly containing liquid amic acid on the entire wafer surface so as to have a thickness of about 20–60 μm. The resin layer R is thereafter polymerized by thermosetting reaction at a temperature not lower than 300° C. However, the resin containing the amic acid before thermosetting is very active at the above temperature so that it reacts with Cu, thus deteriorating the interface. However, the provision of the $Si_3N_4$ film on the surface of the wiring layer prevents the resin layer from reacting with Cu. The $Si_3N_4$ film has a thickness of about 100–300 nm.

The $Si_3N_4$ film has excellent in barrier property whereas an $SiO_2$ film is inferior in the barrier property. Therefore, if the $SiO_2$ film is adopted, it must be formed to have a larger thickness than the $Si_3N_4$ film. Further, the $Si_3N_4$ film, which can be formed by plasma CVD, can have excellent step coverage. Further, since the insulating resin layer R is provided after the metal post 8 has been formed, the provision of the $Si_3N_4$ film prevents the reaction between the wiring layer 7 made of Cu and the insulating resin layer mainly containing the amic acid and between the metal post made of Cu and the insulating resin layer R mainly containing the amic acid.

If the solder ball is formed directly on the metal post made of Cu, the connecting strength therebetween will be deteriorated owing to oxidation of Cu. If Au is directly is formed directly on the Cu metal post in order to prevent the oxidation of Cu, Au will disperse. For this reason, Ni is interposed between the metal post of Cu and Au. The Ni layer prevents the oxidation of Cu, and the Au layer prevents the oxidation of Ni. Thus, the deterioration of the solder ball and connecting strength will be suppressed.

Although both Ni layer and Au layer are formed by electrolytic plating, they can be formed by non-electrolytic plating.

Finally, the solder ball 12 is formed on the head of the metal post 8.

An explanation will be given of a difference between the solder ball and solder bump. The solder ball is prepared separately as a ball-shaped solder and fixed on the metal post. On the other hand, the solder bump is formed by the electrolytic plating by way of the wiring layer 7 and metal post 8. Namely, the solder bump is first formed as a film having a certain thickness and formed into a ball by the heat treatment in the post step.

Figure 6:
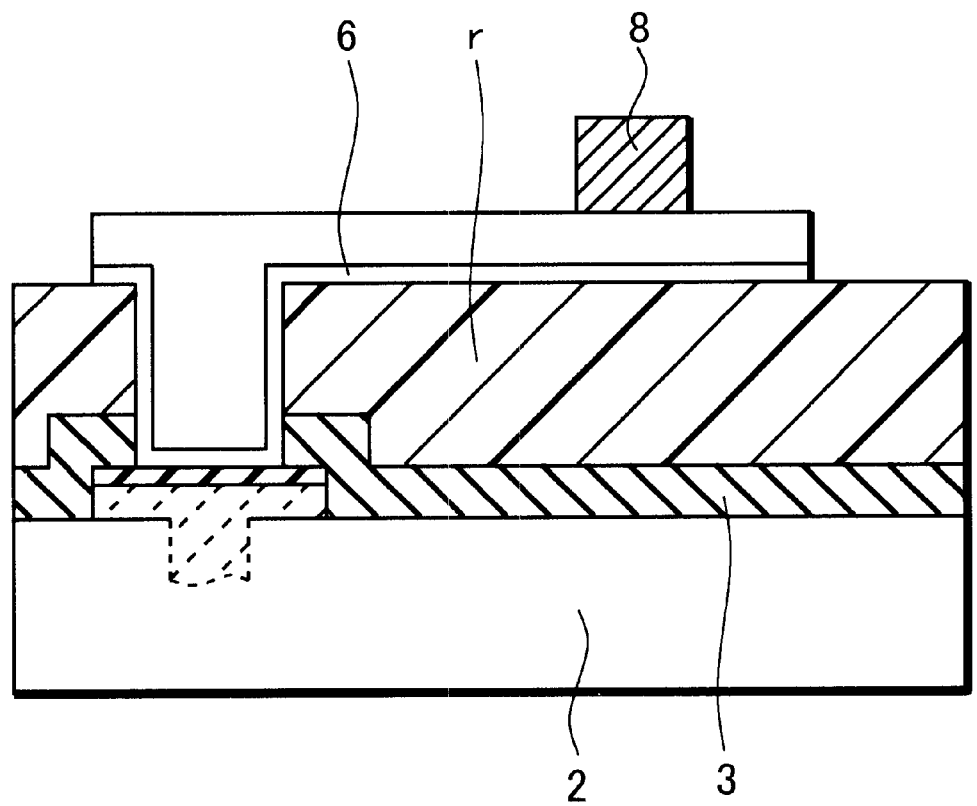

In this embodiment, as seen from FIG. 6, since the seed layer 6 has been removed, the solder bump cannot be formed by electrolytic plating. Instead of this, the solder ball is actually prepared.

An explanation will be given of a method of manufacturing the structure shown in FIG. 7.

First, a semiconductor substrate (wafer) with an LSI having an Al electrode 1 formed is prepared. The LSI is an IC composed of a single layer metal, a double layer metal, multi-layer metal as described above. For example, a source electrode and drain electrode of a transistor are formed as the first layer metal and the Al electrode 1 in contact with the drain electrode is formed as the second layer metal.

After a contact hole C from which the drain electrode is exposed is made in an interlayer insulating film 2, the entire surface of the wafer is covered with an electrode material made of mainly Al and a Ti nitride film 5. Using a photoresist layer as a mask, the Al electrode 1 and Ti nitride film 5 are dry-etched in a prescribed shape.

Unlike the case where a barrier metal is formed in the contact hole C made after a passivation film 3 is formed, the Al electrode inclusive of the Ti nitride film serving as the barrier metal can be formed using the photoresist layer. This reduces the number of manufacturing steps.

The Ti nitride film 5 serves as the barrier metal for a Cu thin film layer 6 to be formed later. In addition, the Ti nitride film 5 is efficiently used as an anti-reflective film. Namely, the Ti nitride film 5 is also efficient to prevent halation of the resist used for patterning. For the purpose of preventing the halation, the Ti nitride film 5 must have a thickness of at least 120 nm–130 nm. Further, the Ti nitride film 5 has a thickness of preferably 200 nm–300 nm in order to have a function of the barrier metal. The Ti nitride film 5 having a thickness exceeding this thickness leads to occurrence of stress.

After the Al electrode 1 and Ti nitride film 5 are formed, the entire surface of the wafer is covered with the passivation film 3. In this embodiment, the passivation film 3 is made of $Si_3N_4$, but may be made of polyimide resin (see FIG. 1 hitherto).

Next, the surface of the passivation film 3 is covered with an insulating resin layer r. The insulating resin layer r is made of a positive-type photosensitive polyimide film and has a thickness of about 3–5 μm. An opening K is made in the passivation film 3 and insulating resin layer r.

Provision of the photosensitive polyimide film 3 makes it unnecessary to use an individual photoresist layer to pattern the opening K and provision of the metal mask simplifies the manufacturing process. It is needless to say that the individual photoresist layer may be used. The polyimide layer is also used for the purpose of flattening. Specifically, in order that the height of a solder ball 12 is uniform in all the regions, the height of the metal post 8 must be also uniform, and the wiring layer 7 must be formed flat with great accuracy. Since the polyimide resin has fluidity with a certain viscosity, its application realizes flatness of the resultant surface.

Figure 2:
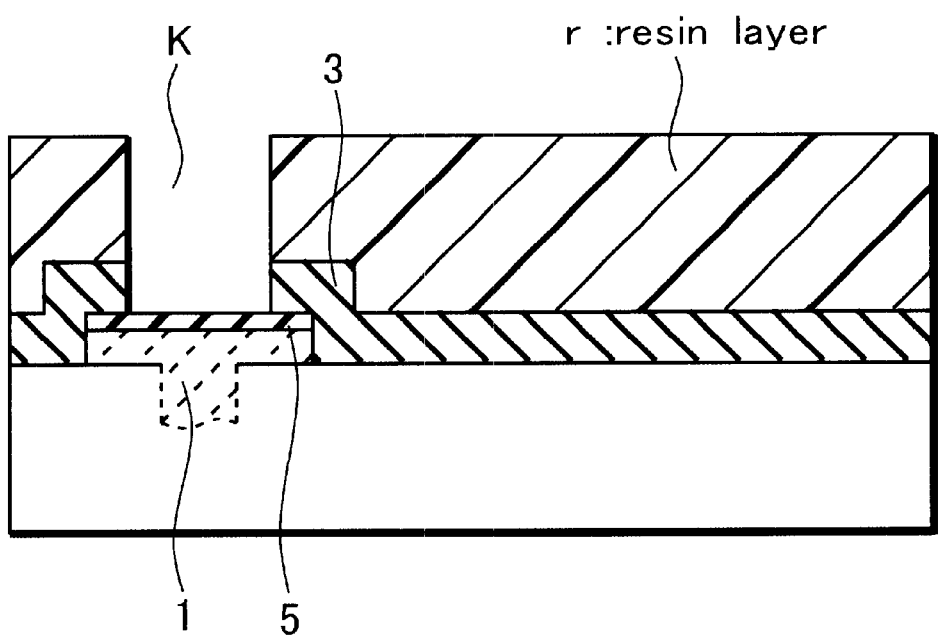

The Al electrode 1 also serves as a pad for external connection of the LSI and as a wire bonding pad when a chip size package having the solder ball (solder bump) is formed (see FIG. 2 hitherto).

The entire surface is covered with the Cu thin film layer 6. This Cu thin film layer 6 constitutes a plating electrode for a wiring layer 7 (FIG. 3), and is formed by e.g. sputtering to have a thickness of about 100–200 nm.

Figure 3:
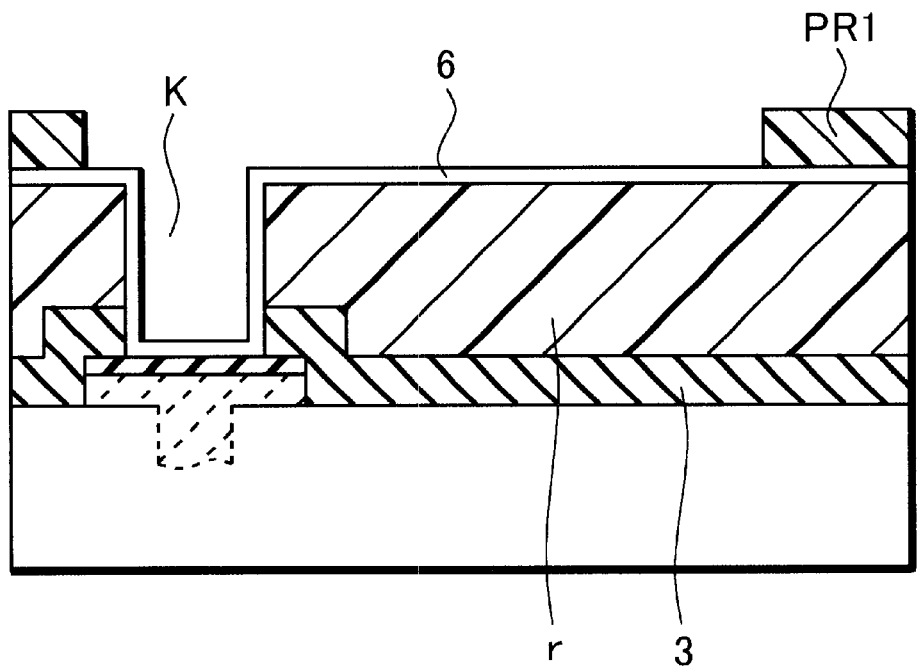

A photoresist layer PR1 is applied on the entire surface and the portion thereof corresponding to the wiring layer 7 (see FIG. 3 hitherto).

The wiring layer is formed using the Cu thin film layer 6 exposed in the opening of the photoresist layer PR1 as a plating electrode. This wiring layer 7 should have a relatively great thickness of about 2–5 μm in order to assure the mechanical strength. The wiring layer may be formed by vacuum evaporation, sputtering, etc. instead of electrolytic plating.

Figure 4:
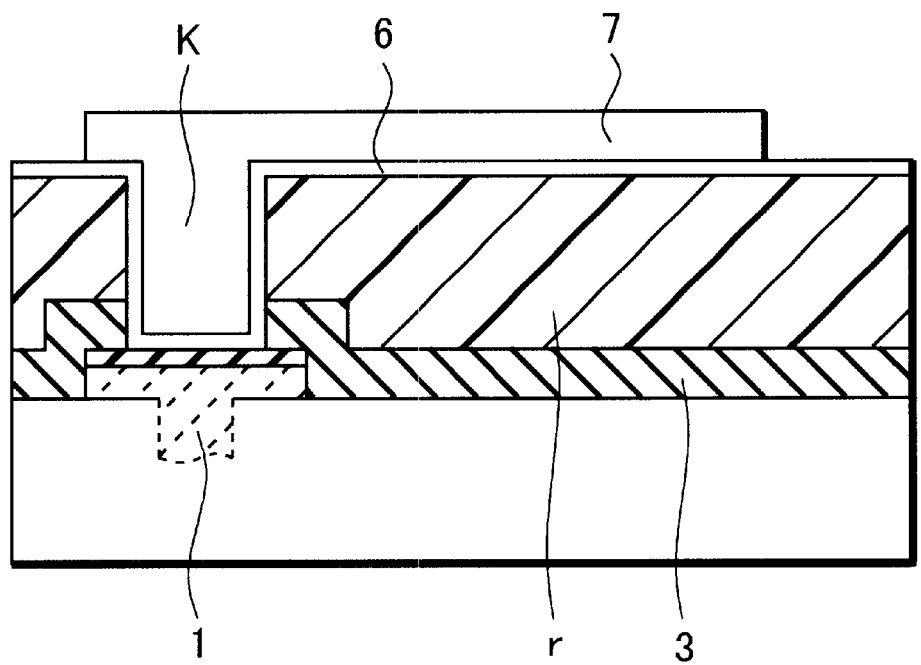

Thereafter, the photoresist layer PR1 is removed (see FIG. 4 hitherto).

Figure 5:
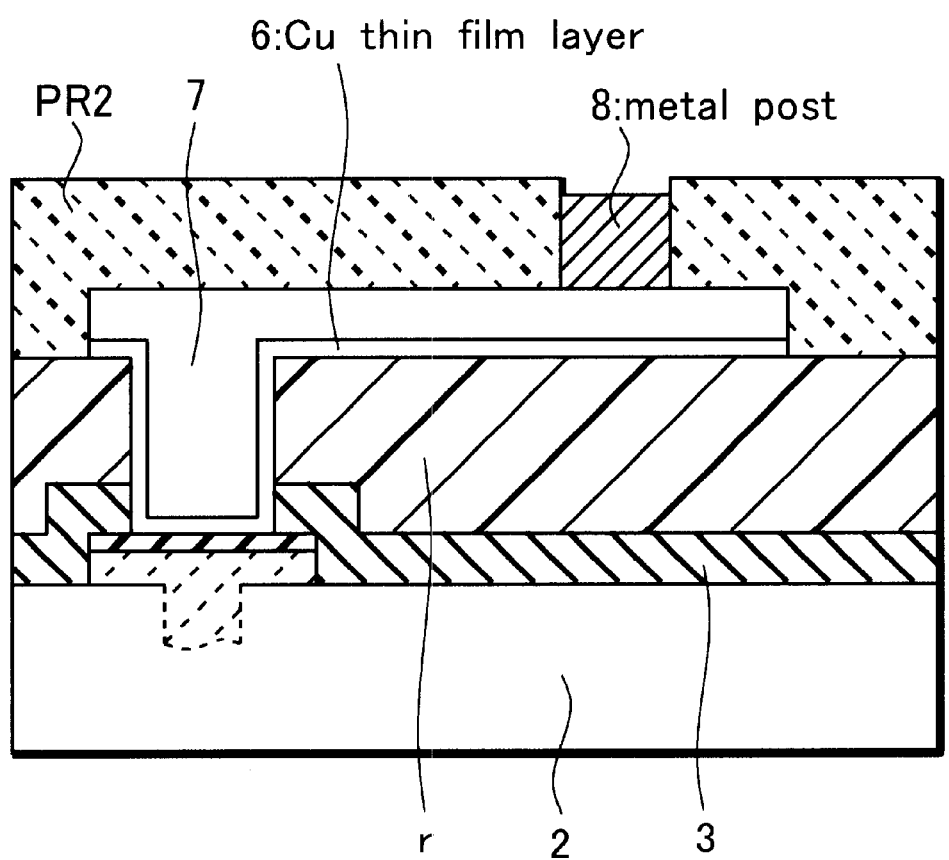

A photoresist layer PR2 in which an area where a metal post 8 is to be formed on the wiring layer 7 is exposed is formed. The metal post 8 of made of Cu is formed in the exposed area to have a thickness of about 30–100 μm. In this case also, the thin film layer 6 is used as a plating electrode (seen FIG. 5 hitherto).

The photoresist layer PR2 is removed, and further the Cu thin film layer 6 is removed using the wring layer 7 as a mask (see FIG. 6 hitherto).

Although the step to be performed subsequently is not shown, the entire surface inclusive of the wiring layer 7 and metal post 8 may be covered with a $Si_3N_4$ film by plasma CVD.

The $Si_3N_4$ film is formed to obviate the deterioration of the interface due to the thermal reaction between the resin layer R before hardening to be formed later and Cu. To this end, the entire surface of the wiring layer 7 and metal post 8 must be covered with the $Si_3N_4$ film. Where the interface deterioration does not occur, this $Si_3N_4$ film is not required.

Further, after a resin layer R is applied on the entire surface, it is polished to expose the head of the metal post 8.

Subsequently, a Ni layer 10 having a thickness of about 100 nm is formed on the head of the metal post 8 by electrolytic plating and an Au layer 11 having a thickness of about 500 nm is formed on the Ni layer 10. A solder ball is loaded on the Au layer 11 (see FIG. 7 hitherto)

Referring to FIGS. 8 and 9, an explanation will be given of the dicing step which is a feature of the invention.

Figure 8A:
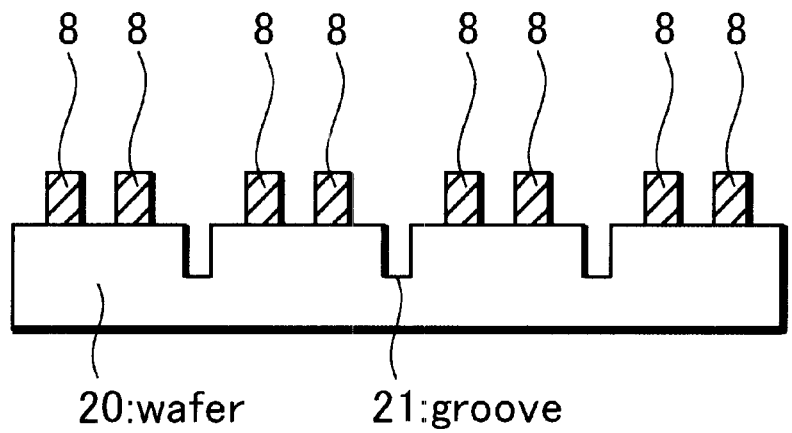

First, as seen from FIG. 8A, the wafer 20 with the metal posts 8 formed thereon is diced to a prescribed depth using a dicing cutter (not shown) to form grooves 21. Incidentally, in this step, the wafer is diced to a position of the depth exceeding the final thickness of the wafer as described later.

Figure 8B:
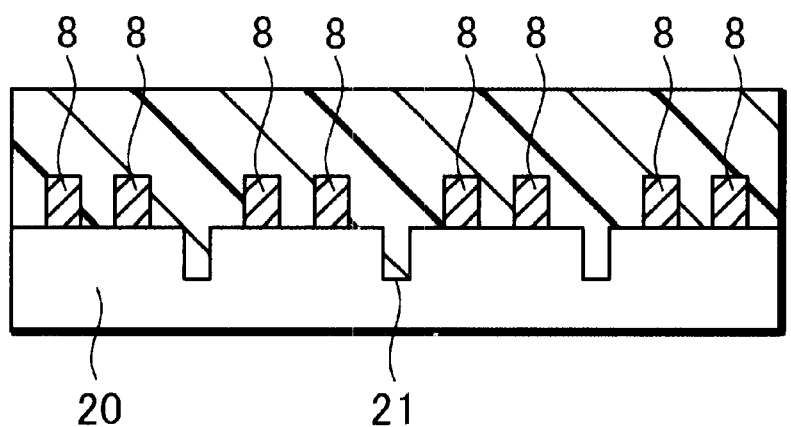

As seen from FIG. 8B, the entire surface of the wafer 20 inclusive of the grooves 21 is resin-sealed by epoxy resin (resin layer).

Figure 8C:
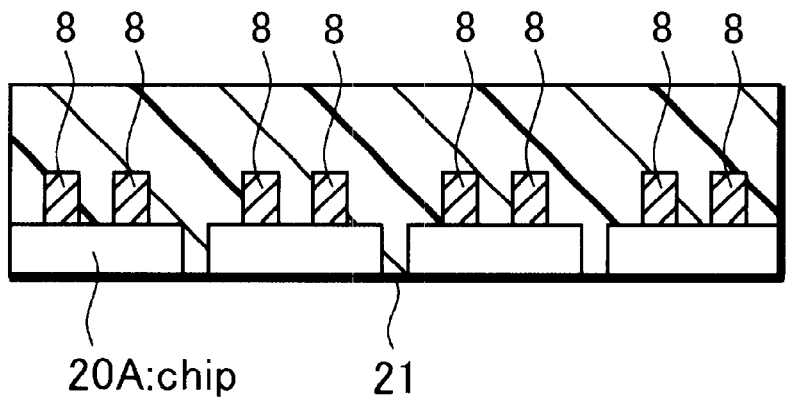

As seen from FIG. 8C, the rear surface of the wafer 20 is ground (back grinding BG). In this case, the wafer 20 is ground to the bottom of each of the grooves formed by the dicing step (Thus, the wafer 20 is ground to have the final thickness so that it is divided into individual chips 20A. At this time, the respective chips are integrated by the resin layer R).

Figure 9A:
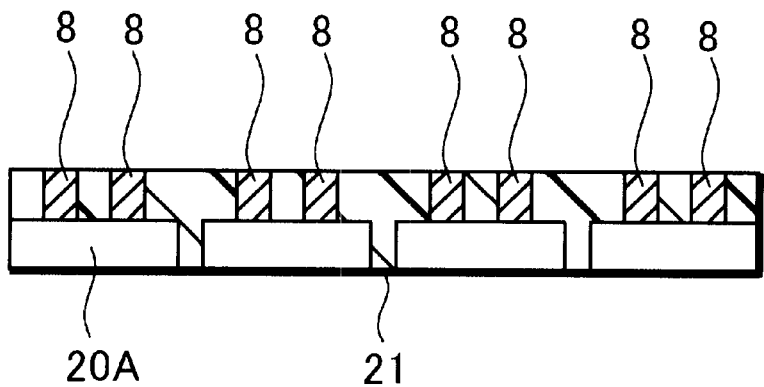

Further, as seen from FIG. 9A, the resin layer R is ground to expose the head of each of the metal posts 8.

Figure 9B:
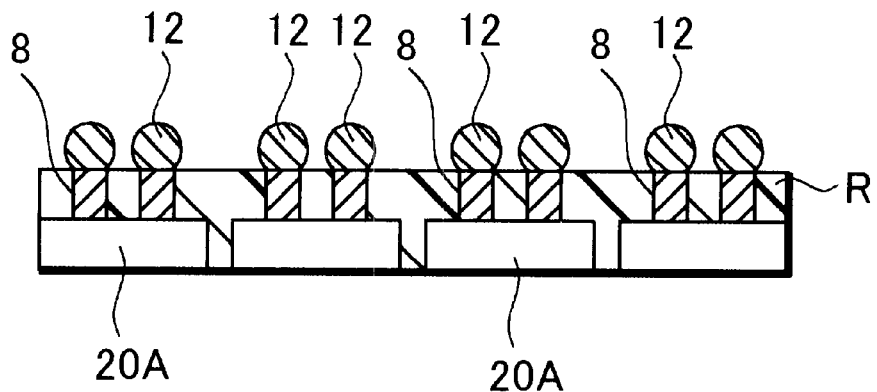
Figure 9C:
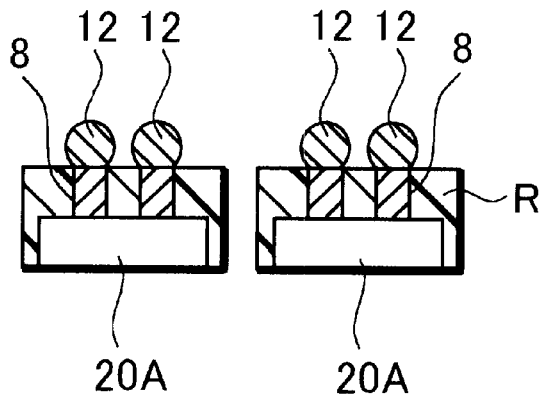
Figure 10:
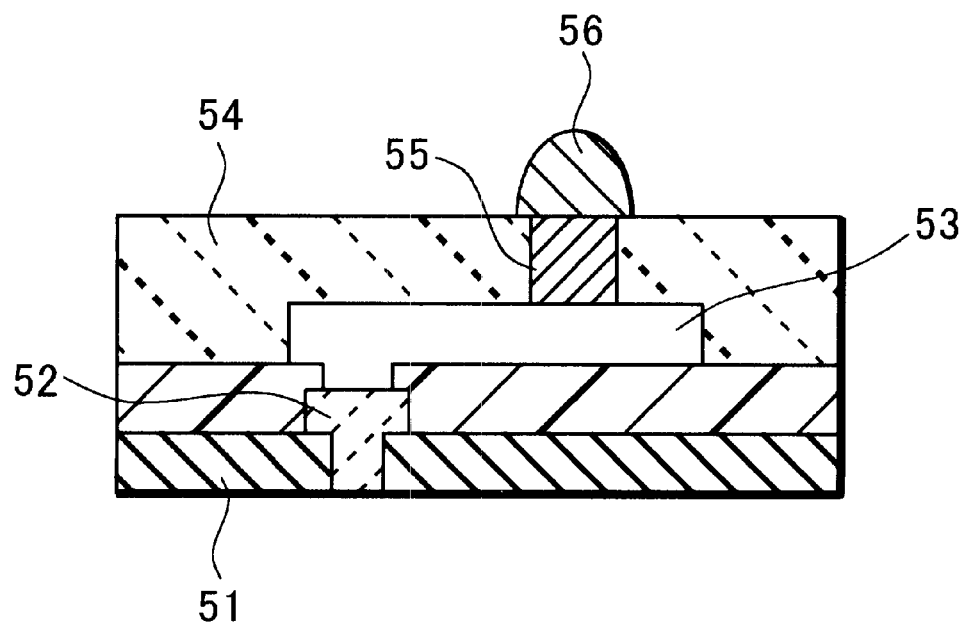
FIG. 10 is a sectional view of a conventional chip size package.

Finally, as seen from FIG. 9B, a solder ball 12 is aligned with and loaded on the metal post 8 through the Ni layer 10 and Au layer 11 (see FIG. 7), and is subjected to "reflow". As seen from FIG. 9C, the wafer (the portion of the resin layer R embedded in the groove 21) is diced so that it separated into chips 20A along a scribing line. Thus, a chip size package is completed.

The dicing cutter used in this dicing step has a more narrow blade width than that of the dicing cutter used in the dicing step for forming the grooves 21. For this reason, as seen from FIG. 9C, the side of each chip 20A is covered with the resin layer R. Thus, the contact between the chip 20A and the resin layer R is improved and the resistance of the chip 20A to moisture is also improved.

As understood from the description hitherto made, in accordance with the invention, after the metal posts are formed and before the wafer is resin-sealed, the wafer is diced to the prescribed position of depth (not less than final wafer thickness); the entire surface of the wafer 20 inclusive of the grooves 21 formed by this dicing step is resin-sealed, and the rear surface of the wafer is subjected to the back grinding (BG) to the position (dicing point) of the bottom of each groove 21. Thus, wafer stress is released when the dicing by BG reaches the dicing point. This suppresses the warp of the wafer which has been generated conventionally.

As a result, the transporting error in the manufacturing line can be suppressed so that the wafer having a larger diameter can be dealt with. The process according to the invention permits the wafer having a thickness of 600 μm to be thinned to 250–200 μm (in the conventional process, it is limited to about 300 μm).

The thickness of the semiconductor wafer is preferably 400–800 μm.

In the grinding step, the semiconductor wafer is preferably ground to 250–200 μm.

In the process described above, the metal post can have a higher or longer height. Therefore, the stress generated owing to the difference in the thermal expansion coefficient between the wafer and a printed board can be dispersed by these longer metal posts. This leads to further improvement in the reliability of the chip.

The dicing cutter used in the wafer dicing step has a more narrow blade width than that of the dicing cutter used in the dicing step for forming the grooves 21. For this reason, as seen from FIG. 9C, the side of each chip 20A is covered with the resin layer R. Thus, the contact between the chip 20A and the resin layer R is improved and the resistance of the chip 20A to moisture is also improved.

In accordance with the invention, in order to reduce the influence of wafer stress, after the metal posts has been formed, the wafer is diced to the position of a prescribed depth to form grooves; the entire surface of the wafer inclusive of the grooves is resin-sealed; and the rear surface of the wafer is diced to the position of the bottom of each groove so that the wafer is divided into individual chips. According to such a process, the warp of the wafer owing to the wafer stress and resin stress which has been generated conventionally can be suppressed.

As a result, the transporting error in the manufacturing line can be suppressed so that the wafer having a larger diameter can be dealt with.

Further, since the generation of the warp of the wafer can be suppressed, the metal post having a higher or longer height can be formed. In this case, the stress generated owing to the difference in the thermal expansion coefficient between the wafer and a printed board serving as a mounting board can be dispersed by these longer metal posts. This leads to further improvement in the reliability of the chip.

In the dicing step for chip division, dicing is carried out using the dicing cutter having a more narrower width than that of the dicing cutter used in the dicing step for forming the grooves. Therefore, after the dicing for chip division, the resin layer is left on the side of each chip. Thus, the contact between the chip and the resin layer is improved and the resistance of the chip to moisture is also improved.

What is claimed is:

1. A method of manufacturing a semiconductor device comprising the steps:

preparing a semiconductor wafer having a wiring layer for external connection and a dicing groove having a prescribed depth;

covering an upper surface of the semiconductor wafer with a resin layer;

grinding the semiconductor wafer from its lower surface to the bottom of the groove;

grinding said resin layer to expose the head of said wiring layer; and forming an external connection terminal to said exposed head.

2. A method of manufacturing a semiconductor device according to claim 1, wherein said step of preparing the semiconductor wafer comprises the steps:

forming a metal post on a surface of the semiconductor wafer in which a desired element region is formed; and forming the dicing groove having a prescribed depth.

3. A method of manufacturing a semiconductor device according to claim 1, wherein said step of forming said external connection terminal comprises the step of:

forming a solder ball on said exposed head.

4. A method of manufacturing a semiconductor device according to claim 1, wherein said step of preparing said semiconductor wafer comprises the steps of:

forming an electrode pad and an insulating layer after a desired element region has been formed and forming the wiring layer connected to an electrode pad exposed from said insulating layer through a seed layer and extending to a chip surface; and after having formed a photoresist layer with an opening made so as to be located on said wiring layer, forming a metal post on said wiring layer through said photoresist layer.

5. A method of manufacturing a semiconductor device according to claim 4, wherein said step of preparing a semiconductor wafer comprises the step of:

after having removed said photoresist layer and seed layer, dicing the semiconductor wafer to the prescribed depth.

6. A method of manufacturing a semiconductor device according to claim 1, wherein said step of forming a resin layer comprises the step of resin-sealing the semiconductor wafer by transfer mold.

7. A method of manufacturing a semiconductor device according to claim 1, wherein said step of preparing a semiconductor wafer comprises the step of:

forming the dicing groove which reaches a position of depth exceeding a final wafer thickness.

8. A method of manufacturing a semiconductor device according to claim 1, wherein said step of preparing a semiconductor wafer comprises the steps of:

forming a wiring layer connected to an electrode pad exposed from an insulating layer through a seed layer and extending to a chip surface;

after having formed a photoresist layer with an opening made so as to be located on said wiring layer, forming a metal post in contact with said wiring layer in the opening through said photoresist layer;

a first dicing step of, after having removed said photoresist layer and seed layer, dicing the semiconductor wafer to the prescribed depth;

a step of resin-sealing the semiconductor wafer from its upper surface to form the resin layer and thereafter grinding the semiconductor wafer from its lower surface;

a step of grinding said resin layer to expose the head of said metal post; and a second dicing step of dicing the semiconductor wafer into individual chips after having loaded a solder ball on said metal post.

9. A method of manufacturing a semiconductor device according to claim 8, wherein said second dicing step is performed for the resin layer with a smaller dicing width than that in the first dicing step.

10. A method of manufacturing a semiconductor device according to claim 2, wherein said metal post is made of Cu.

11. A method of manufacturing a semiconductor device according to claim 1, wherein said semiconductor wafer has a thickness of 400–800 µm.

12. A method of manufacturing a semiconductor device according to claim 1, wherein said semiconductor wafer has a thickness of 250–200 µm.

13. A method of manufacturing a semiconductor device according to claim 1, wherein said step of covering an upper surface of the semiconductor wafer with a resin layer comprises spin-coating amic acid film, polyimide, or epoxy resin.

* * * * *